(12) United States Patent
Tsai et al.

(10) Patent No.: US 8,981,622 B2
(45) Date of Patent: Mar. 17, 2015

(54) ULTRASONIC SENSOR DEVICE

(71) Applicant: Tung Thih Electronic Co., Ltd., Luzhu Township, Taoyuan County (TW)

(72) Inventors: Tzu-Chin Tsai, Luzhu Township (TW); Chiun-Hua Chang, Luzhu Township (TW); Shih-Feng Lee, Luzhu Township (TW)

(73) Assignee: Tung Thih Electronic Co., Ltd., Taoyuan County (TW)

( * ) Notice: Subject to any disclaimer, the term of this patent is extended or adjusted under 35 U.S.C. 154(b) by 226 days.

(21) Appl. No.: 13/756,442

(22) Filed: Jan. 31, 2013

(65) Prior Publication Data

US 2014/0062260 A1 Mar. 6, 2014

(30) Foreign Application Priority Data

Aug. 28, 2012 (TW) .............................. 101131146 A
Aug. 28, 2012 (TW) .............................. 101216515 U

(51) Int. Cl.
| H01L 41/113 | (2006.01) |
|---|---|
| H01L 41/053 | (2006.01) |
| G10K 11/00 | (2006.01) |
| H01L 41/047 | (2006.01) |
| B06B 1/06 | (2006.01) |

(52) U.S. Cl.
CPC ........... *H01L 41/0475* (2013.01); *B06B 1/0644* (2013.01); *G10K 11/004* (2013.01); *H01L 41/1132* (2013.01)
USPC ............................ 310/338; 310/327; 310/348

(58) Field of Classification Search
USPC .......................... 310/320, 334, 326, 327, 338
See application file for complete search history.

(56) References Cited

U.S. PATENT DOCUMENTS

| 3,086,132 | A | * | 4/1963 | Ostrow ......................... 310/338 |
| 4,918,738 | A | * | 4/1990 | Bader ........................... 381/190 |
| 5,648,697 | A | * | 7/1997 | Pirrung et al. ................ 310/338 |
| 2007/0035213 | A1 | * | 2/2007 | Nakajima ..................... 310/348 |

* cited by examiner

*Primary Examiner* — Thomas Dougherty
(74) *Attorney, Agent, or Firm* — Christie, Parker & Hale, LLP

(57) ABSTRACT

An ultrasonic sensor device includes a housing, a transducer, a securing unit and a circuit board. The housing has an enclosing portion formed with first and second openings. The transducer is mounted to the enclosing portion at the second opening, and includes an electrically conductive surrounding wall and a piezoelectric member. The securing unit includes a securing component that secures the transducer on the enclosing portion, and a connecting pin set including two pins each having an end connected electrically to a respective one of the surrounding wall and the piezoelectric member. The circuit board is disposed at the first opening of the enclosing portion for electrical connection with the connecting pin set.

8 Claims, 6 Drawing Sheets

FIG. 3

ULTRASONIC SENSOR DEVICE

CROSS-REFERENCE TO RELATED APPLICATION

This application claims priority of Taiwanese Application No. 101131146 and No. 101216515, filed on Aug. 28, 2012.

BACKGROUND OF THE INVENTION

1. Field of the Invention

The invention relates to an ultrasonic sensor device that is capable of transmitting a sensing signal.

2. Description of the Related Art

Shown in FIG. 1 is a conventional ultrasonic sensor device 2, as described in Taiwanese Patent No. M433689. The ultrasonic sensor device 2 includes a housing 21 with a connecting portion 23, and a transducer 24. A circuit board 22 is disposed in the housing 21. As shown in FIG. 2, the transducer 24 has an electrically conductive casing 241 made from aluminum, a piezoelectric member 242 disposed on top of an inner surface of the casing 241, a relaying circuit board 243 disposed above the piezoelectric member 242, and a conductive wire set 244 that electrically interconnects the circuit board 22 and the relaying circuit board 243. The relaying circuit board 243 is further electrically connected to the piezoelectric member 242 via a first connecting wire 246, and to the casing 241 via a second connecting wire 247. The piezoelectric member 242 is operable to generate a sensing signal, which is received by the relaying circuit board 243 and transmitted to the circuit board 22 via the conductive wire set 244. The circuit board 22 is operable to process the sensing signal to generate a processed signal and is mounted with a connecting pin set 221 that includes at least two connecting pins, which serve to output the processed signal and to connect to ground, respectively.

However, such configuration of the conventional ultrasonic sensor device 2 has some drawbacks. For example, connection between the second connecting wire 247 and the casing 241 is typically by soldering, but the casing 241 is made from a material (aluminum) with a very high melting point that makes soldering difficult. Moreover, the conductive wire set 244, the first connecting wire 246, and the second connecting wire 247 are also connected by soldering, thereby making the manufacturing procedure more difficult. Moreover, the conventional ultrasonic sensor device 2 does not have a mechanism to secure the transducer 24, leaving the transducer 24 vulnerable to undesired removal due to external shock. Additionally, the sensing signal generated by the piezoelectric member 242 is relayed the relaying circuit board 243 before being transmitted to the circuit board 22 for processing. It is preferable that the sensing signal be transmitted directly to the circuit board 22 in order to avoid signal attenuation.

SUMMARY OF THE INVENTION

Therefore, the object of the present invention is to provide an ultrasonic device that is configured to ameliorate at least one of the drawbacks of the prior art mentioned above.

Accordingly, an ultrasonic sensor device of the present invention comprises a housing, a transducer, a securing unit and a circuit board.

The housing includes an enclosing portion, a connection portion and an outer connecting pin set. The enclosing portion is formed with a first opening and a second opening that is opposite to the first opening and that is in spatial communication with the first opening. The first opening and the second opening are aligned along an imaginary axis. The connecting portion has a first end connected to the enclosing portion and a second end formed with a third opening. The outer connecting pin set is disposed in the enclosing portion and has one end extended toward the first opening and another end extended into the connecting portion toward the third opening.

The transducer is mounted to the enclosing portion at the second opening, and includes a base wall, a surrounding wall and a piezoelectric member.

The surrounding wall is made of an electrically conductive material, extends from a periphery of the base wall in a direction of the imaginary axis, is secured to the enclosing portion, and is formed with a pin engaging hole that opens toward the first opening of the enclosing portion. The piezoelectric member is disposed on one surface of the base wall that faces toward the first opening of the enclosing portion.

The securing unit includes a securing component that secures the surrounding wall of the transducer on the enclosing portion of the housing, and an inner connecting pin set disposed on the securing component. The circuit board is disposed at the first opening of the enclosing portion for electrical connection with the one end of the outer connecting pin set.

In some embodiments, the inner connecting pin set of the securing unit includes a first signal transmitting pin having one end connected electrically to the circuit board and another end connected electrically to the piezoelectric member, and a first grounding pin having one end connected electrically to the circuit board and another end extending into the pin engaging hole so as to connect electrically to the surrounding wall.

BRIEF DESCRIPTION OF THE DRAWINGS

Other features and advantages of the present invention will become apparent in the following detailed description of the preferred embodiment with reference to the accompanying drawings, of which:

FIG. 3 is an exploded perspective view of a preferred embodiment of an ultrasonic sensor device according to the invention;

DETAILED DESCRIPTION OF THE PREFERRED EMBODIMENT

Figure 1:
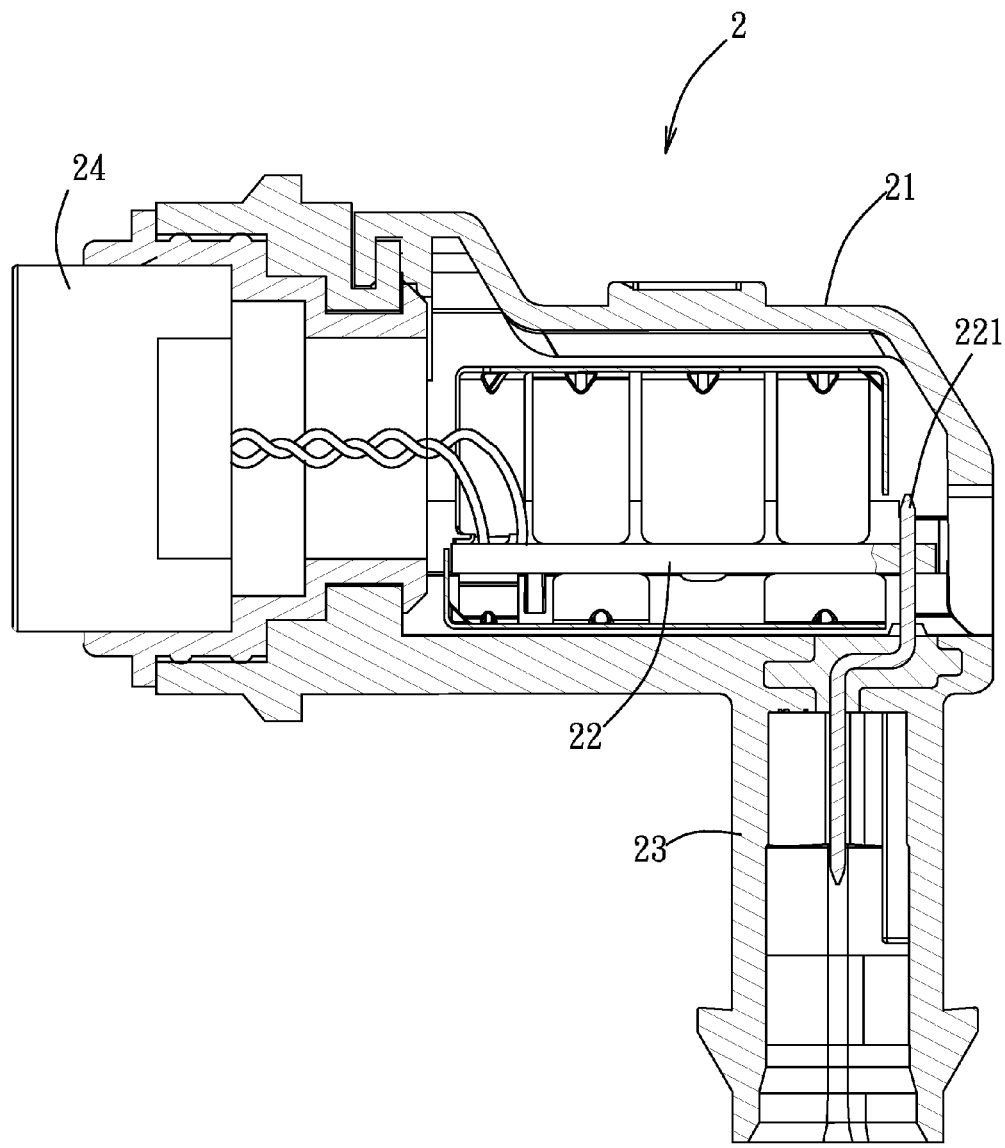
FIG. 1 is a sectional view of a conventional ultrasonic sensor device.
Figure 2:
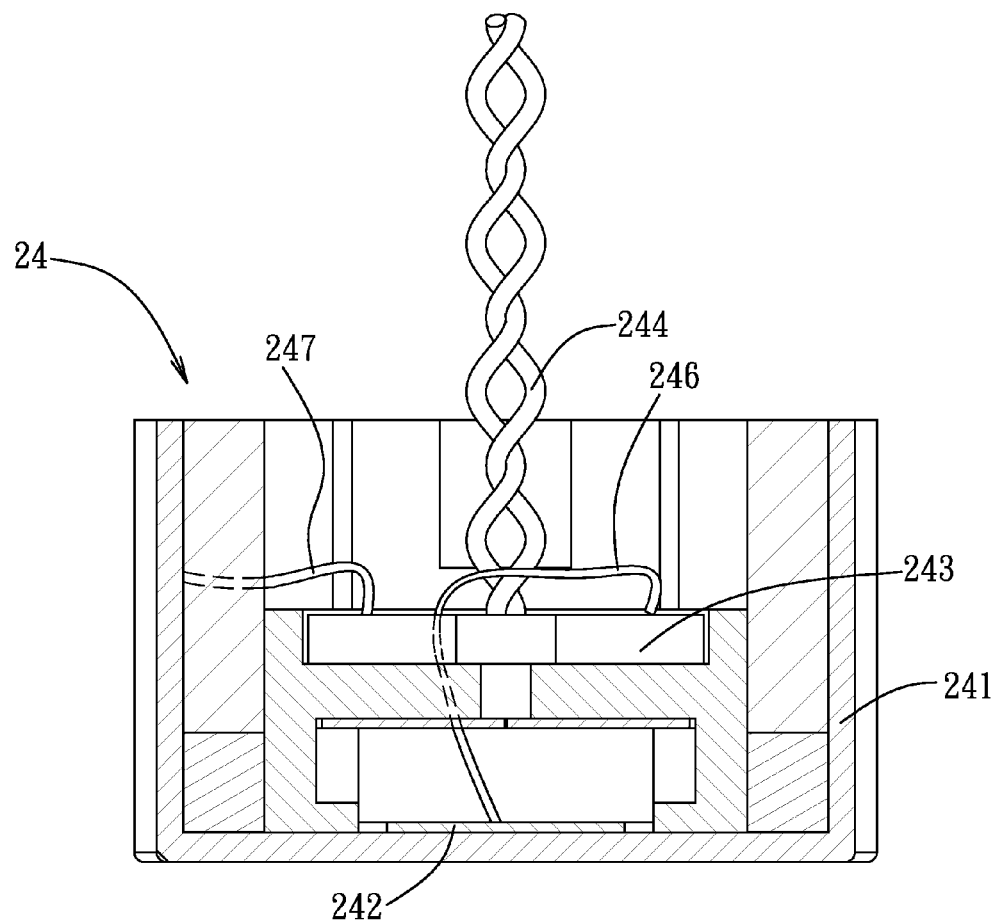
FIG. 2 is a sectional view of a transducer of the conventional ultrasonic sensor device.
Figure 3:
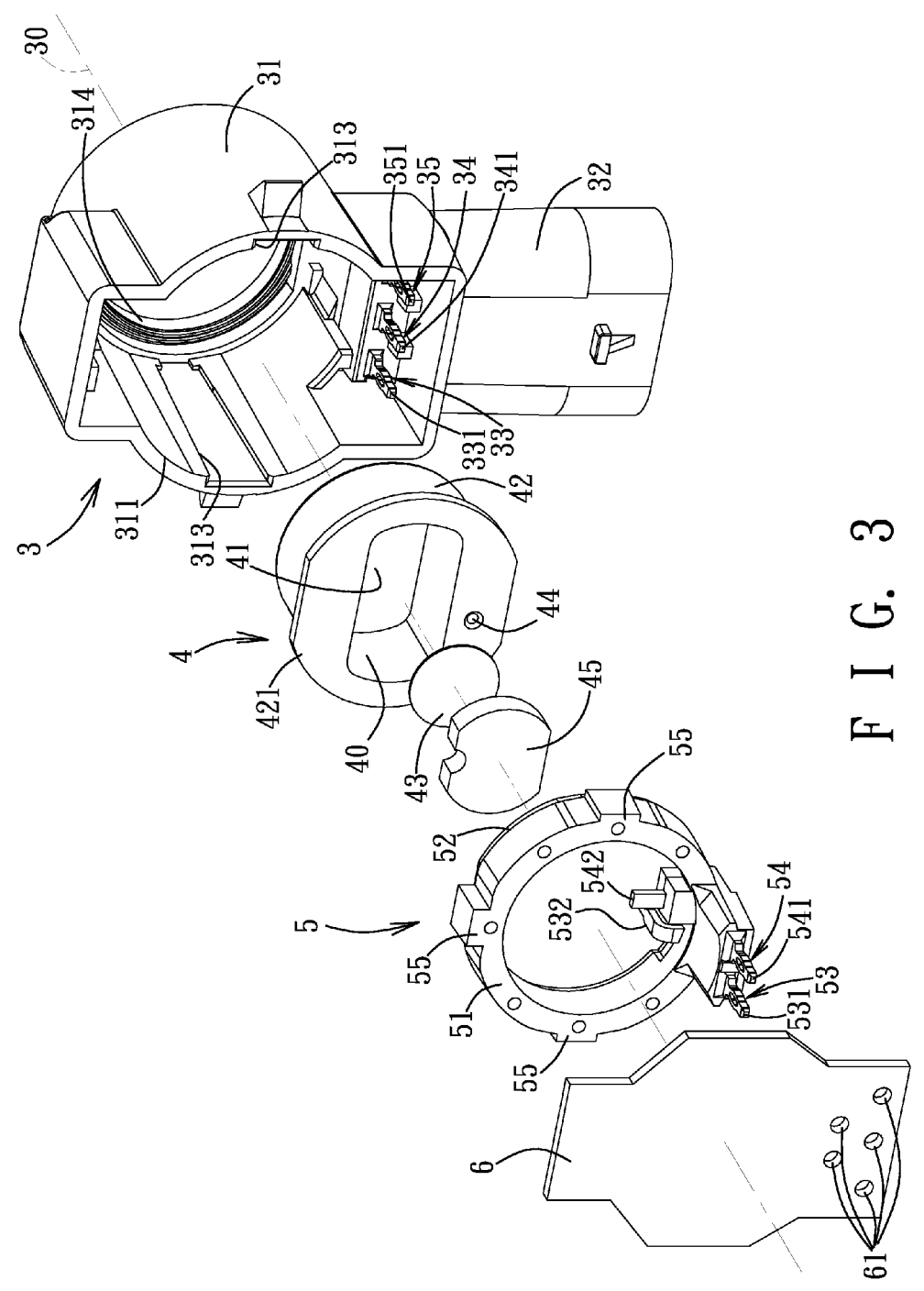
Figure 4:
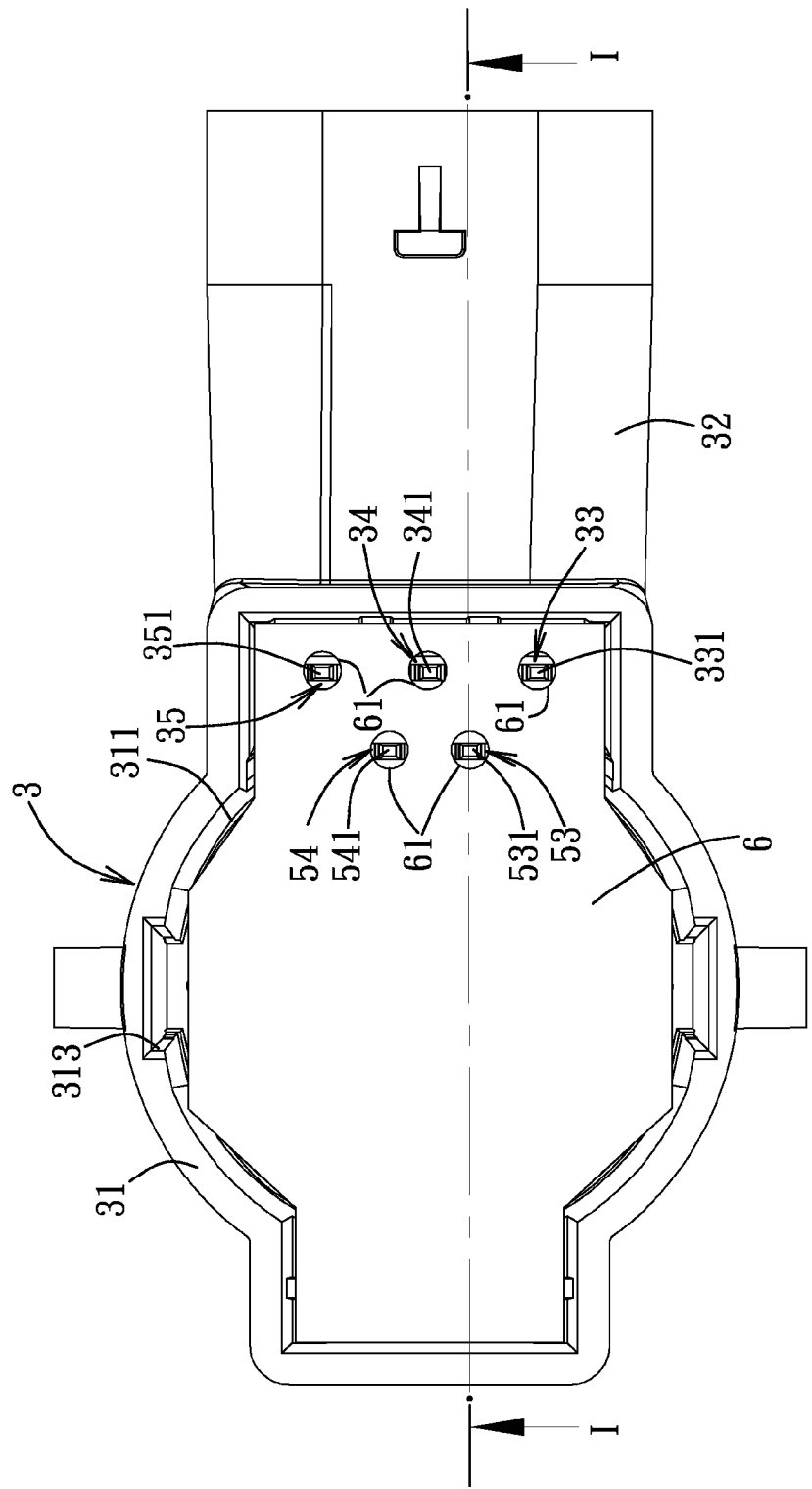
FIG. 4 is a top view of the assembled ultrasonic sensor device according to the embodiment, including a circuit board.
Figure 5:
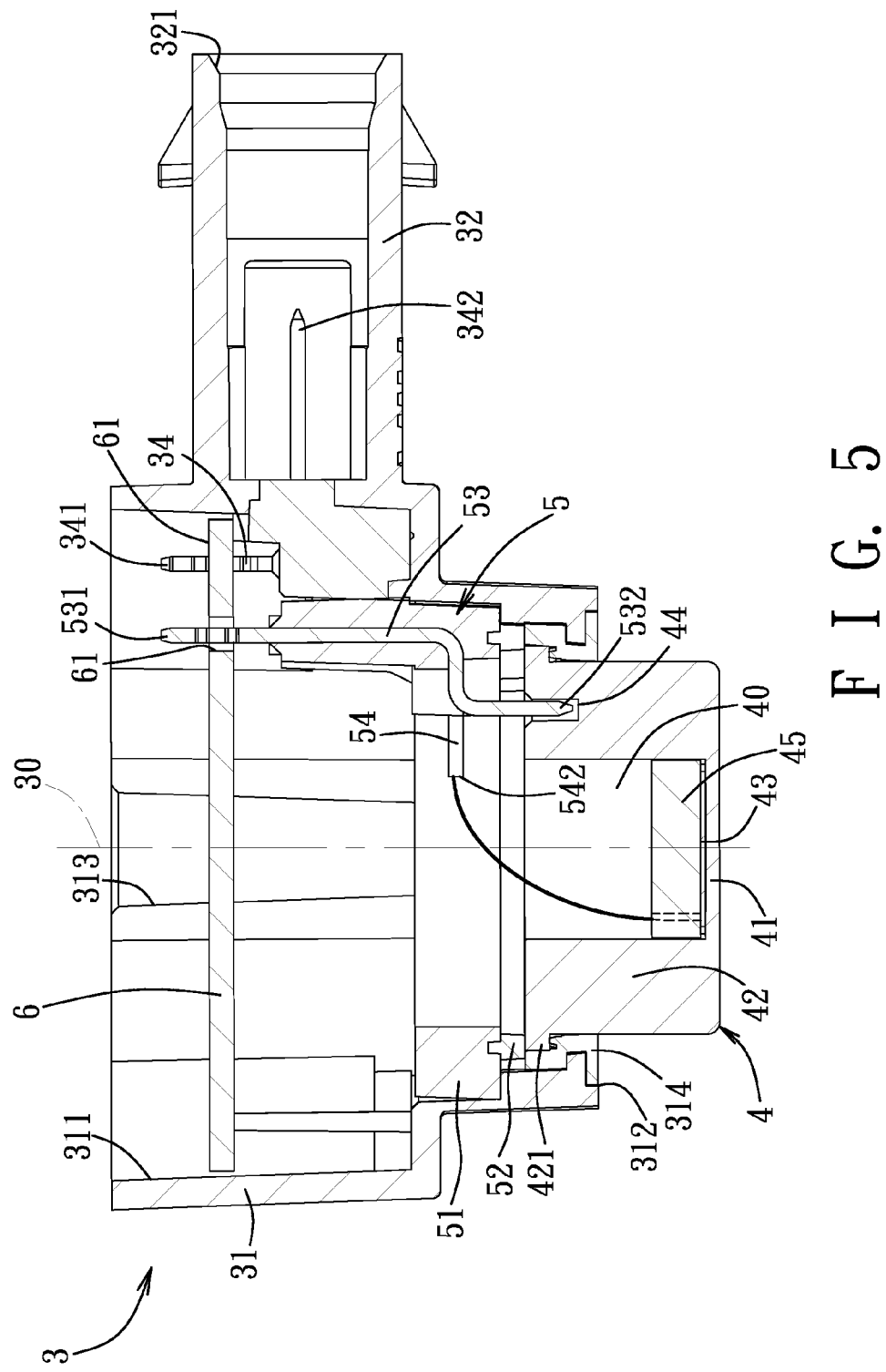
FIG. 5 is a sectional view taken along line I-I of FIG. 4, illustrating components of the embodiment.
Figure 6:
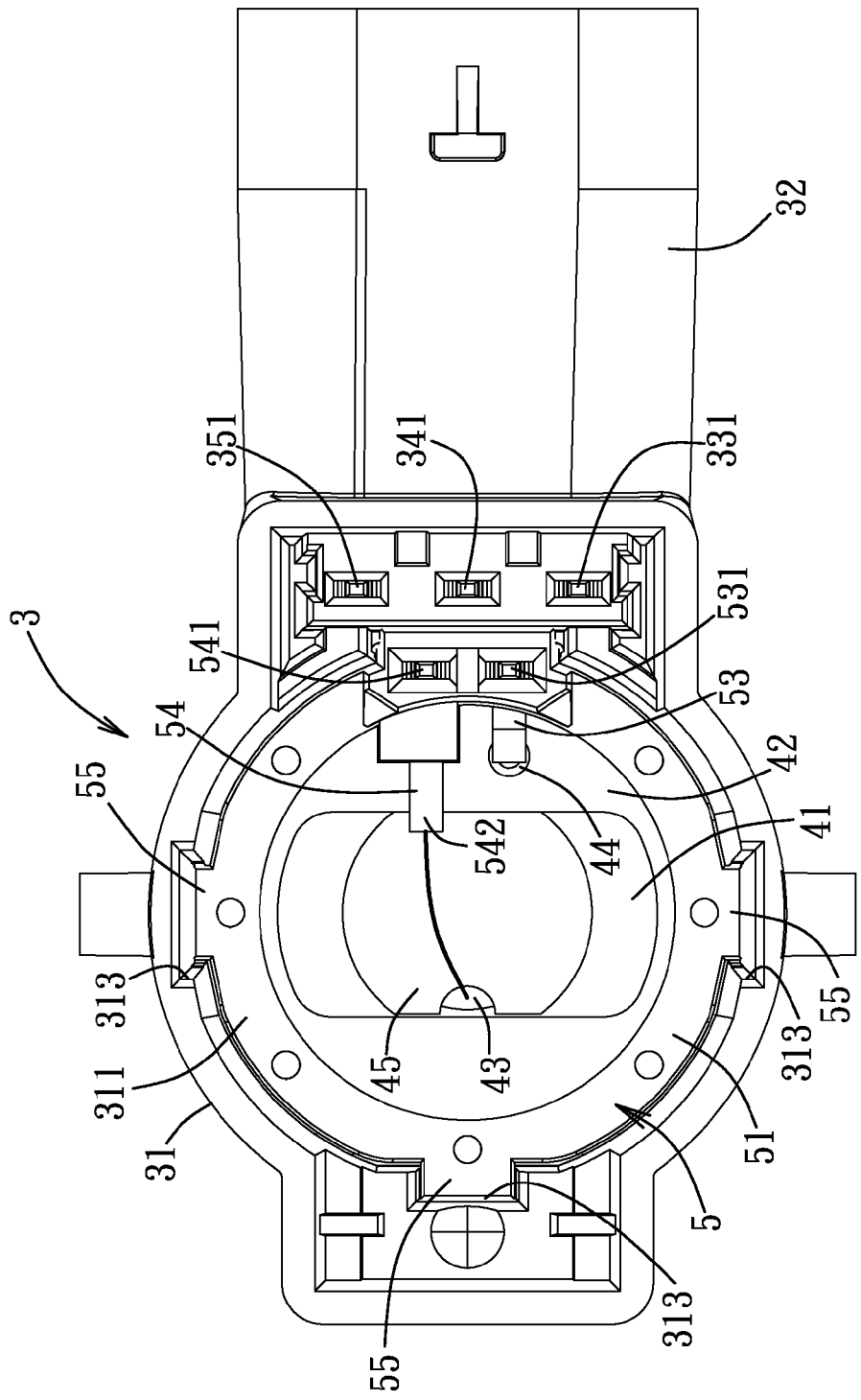
FIG. 6 is a top view similar to FIG. 4 but omitting the circuit, board for a clearer illustration.

As shown in FIGS. 3 to 6, the preferred embodiment of an ultrasonic sensor device according to the present.

invention comprises a housing 3, a transducer 4, a securing unit 5 and a circuit board 6.

The housing 3 includes an enclosing portion 31, a connecting portion 32 and an outer connecting pin set. The enclosing portion 31 is formed with a first opening 311 and a second opening 312 that is opposite to the first opening 311, and that is in spatial communication with the first opening 311. The first and second openings 311 and 312 are aligned along an imaginary axis 30. The housing 3 further includes a resilient first shock-absorbing ring 314 disposed at the second opening 312 of the enclosing portion 31. In this embodiment, the enclosing portion 31 of the housing 3 can be manufactured via co-injection molding, such that the first shock-absorbing ring 314 can be made of a resilient material, which can be different from that of the enclosing portion 31. An inner surface of the enclosing portion 31 is formed with three grooves 313 that extend in the direction of the imaginary axis 30. The connecting portion 32 can be configured to connect to a receiver (e.g., a processor of a parking distance monitoring system), and has a first end connected to the enclosing portion 31, and a second end forming with a third opening 321. The outer connecting pin set is disposed. in the enclosing portion 31.

The transducer 4 is mounted to the enclosing portion 31 at the second opening 312, and has a portion surrounded by the first shock-absorbing ring 314. The transducer 4 includes a base wall 41, a surrounding wall 42 that is made of an electrically conductive material, and a piezoelectric member 43. A periphery of the surrounding wall 42 is made to match an inner periphery of the first shock-absorbing ring 314. The surrounding wall 42 extends from a periphery of the base wall 41 in the direction of the imaginary axis 30, is secured to the enclosing portion 31, and is formed with a pin engaging hole 44 that opens toward the first opening 311 of the enclosing portion 31. The transducer 4 has a limiting flange 421 that extends radially and outwardly from the surrounding wall 42, such that the transducer 4 is prohibited from being detached from the enclosing portion 31 through the second opening 312. The base wall 541 and the surrounding wall 42 of the transducer 4 cooperate to define a receiving space 40. The piezoelectric member 43 is disposed on one surface of the base wall 41 within the receiving space 40, and is configured to generate a sensing signal based on an external ultrasonic signal sensed thereby. A shock-absorbing component 45, which is made from foam material in this embodiment, is disposed in the receiving space 40 to press the piezoelectric member 43.

The securing unit 5 has a ring shape in this embodiment, and includes a securing component 51, a second shock-absorbing ring 52, an inner correcting pin set, and three protrusions 55. The securing component 51 is configured to secure the surrounding wall 42 of the transducer 4 on the enclosing portion 31 of the housing 3. The second shock-absorbing ring 52 is disposed at the securing component 51, and has an inner periphery that is identical in configuration to that of the first shock-absorbing ring 314. Thus, the first and second shock-absorbing rings 52 and 314 cooperate to clamp the limiting flange 421 of the surrounding wall 42 therebetween. The inner connecting pin set is disposed on the securing component 51. The protrusions 55 are provided on an outer periphery of the securing component 51 and are configured to respectively engage the grooves 313 of the enclosing portion 31 (see FIG. 6), such that the securing component 5 is limited to move in the direction of the imaginary axis 30. It is noted that, while in this embodiment, the configurations of engagement between the grooves 313 and the protrusions 55 are as described above, other configurations may be found in other embodiments. For example, the securing unit 5 can be formed with a groove, while the inner surface of the enclosing portion 31 can be formed with a protrusion.

The circuit board 6 is disposed at the first opening 311 of the enclosing portion 31, and is formed with a pin engaging port set. In this embodiment, the pin engaging port set includes five pin engaging ports 61.

In this embodiment, the inner connecting pin set of the securing unit 5 includes a first grounding pin 53 and a first signal transmitting pin 54. The first grounding pin 53 has one end 531 connected electrically to one of the pin engaging ports 61 of the circuit board 6 and another end 532 extending into the pin engaging hole 44 so as to connect electrically to the surrounding wall 42. The first signal transmitting pin 54 has one end 541 connected electrically to one of the pin engaging ports 61 of the circuit board 6 and another end 542 connected electrically to the piezoelectric member 43. In this embodiment, the electrical connection between the end 542 of the first signal transmitting pin 54 and the piezoelectric member 43 is achieved using wire bonding, but other means for connection can be implemented in other embodiments, such as a direct connection.

The outer connecting pin set includes a second grounding pin 33, a second signal transmitting pin 34 and a power in 35. The second signal transmitting pin 33 has one end 331 connected electrically to one of the pin engaging ports 61 of the circuit board 6, and another end extended into the connecting portion 32. The second grounding pin 34 has one end 341 connected electrically to one of the pin engaging ports 61 of the circuit board 6 for electrical connection with the first grounding in 53 via the circuit board 6, and another end 342 extended into the connecting portion 32. The power pin 35 has one end 351 connected electrically to one of the pin engaging ports 61 of the circuit board 6 for transmitting electricity thereto, and another end extended into the connecting portion 32.

When in operation, the piezoelectric member 43 of the transducer 4 is first configured to generate the sensing signal upon detection of the external ultrasonic signal. The first signal transmitting pin 54 of the inner connecting pin set is configured to transmit the sensing signal to the circuit board 6. The circuit board 6 is configured to process the sensing signal from the first signal transmitting pin 54, and transmit the processed sensing signal, e.g., to the receiver, via the second signal transmitting pin 34.

Referring back to FIG. 3, in order to assemble the ultrasonic sensor device of this embodiment, the transducer 4, having been placed with the piezoelectric member 43 and the shock-absorbing component 45 in the receiving space 40 thereof, is first placed into the enclosing portion 31 through the first opening 311. Then, the securing unit 5 is placed at the first opening 311, in a way such that each of the protrusions 55 is registered with one of the grooves 313, and the end 532 of the first grounding pin 53 is registered with the pin engaging hole 44 in the surrounding wall 42 of the transducer 4. As a result, the securing unit 5 can be slid into the enclosing portion 31 in the direction of the imaginary axis 30 to abut against the transducer 4, extending the end 532 of the first grounding pin 53 into the pin engaging hole 44. The second shock-absorbing ring 52 is thus disposed to cooperate with the first shock-absorbing ring 314 to clamp the limiting flange 421 therebetween for securing the transducer 4. The end 542 of the first signal transmitting pin 54 is then electrically connected to the piezoelectric member 43 using wire bonding (see FIG. 6). Subsequently, the circuit board 6 is disposed in the enclosing portion. 31 at the first opening 311, and the pin engaging ports 61 of the circuit board 6 are brought to electrically connect to the pins of the inner connecting pin set and the outer connecting pin set. Assembling of the ultrasonic sensor device is thus completed. In this embodiment, the receiving space 40 of the transducer 4 may be filled with a sealing component (e.g., resinous fluid) to encapsulate the piezoelectric member 43 and the shock-absorbing component 45 after the ultrasonic sensor device is assembled. In some examples, the enclosing portion 31 may likewise be filled with the sealing component to encapsulate the circuit board 6 and the securing unit 5.

To sum up, the enclosing portion 31 and the securing unit 5 of this invention are configured to secure the transducer 4, making the transducer 4 more resistant to external shocks. This invention also eliminates the requirement of a relaying circuit board, and the need for soldering, utilizing the first signal transmitting pin 54 to electrically interconnect the piezoelectric member 43 and the circuit board 6. Therefore, signal attenuation can be avoided, and assembling the ultrasonic sensor device of this invention can be made relatively easy.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An ultrasonic sensor device, comprising:
    a housing including
        an enclosing portion formed with a first opening and a second opening that is opposite to said first opening and that is in spatial communication with said first opening, said first opening and said second opening being aligned along an imaginary axis,
        a connecting portion having a first end connected to said enclosing portion and a second end formed with a third opening, and
        an outer connecting pin set disposed in said enclosing portion and having one end extended toward said first opening and another end extended into said connecting portion toward said third opening;
    a transducer being mounted to said enclosing portion at said second opening, and including
        a base wall,
        a surrounding wall that is made of an electrically conductive material, that extends from a periphery of said base wall in a direction of the imaginary axis, that is secured to said enclosing portion, and that is formed with a pin engaging hole that opens toward said first opening of said enclosing portion, and
        a piezoelectric member disposed on one surface of said base wall that faces toward said first opening of said enclosing portion;
    a securing unit including a securing component that secures said surrounding wall of said transducer on said enclosing portion of said housing, and an inner connecting pin set disposed on said securing component; and
    a circuit board disposed at said first opening of said enclosing portion for electrical connection with said one end of said outer connecting pin set;
    wherein said inner connecting pin set of said securing unit includes
        a first signal transmitting pin having one end connected electrically to said circuit board and another end connected electrically to said piezoelectric member, and
        a first grounding pin having one end connected electrically to said circuit board and another end extending into said pin engaging hole so as to connect electrically to said surrounding wall.

2. The ultrasonic sensor device of claim 1, wherein:
    said housing further includes a resilient first shock-absorbing ring disposed at said second opening of said enclosing portion and disposed to surround a portion of said surrounding wall of said transducer;
    said securing unit further has a resilient second shock-absorbing ring disposed at said securing component; and
    said transducer further has a limiting flange that extends radially and outwardly from said surrounding wall and that is clamped between said first and second shock-absorbing rings.

3. The ultrasonic sensor device of claim 1, wherein one of an inner surface of said enclosing portion of said housing and an outer surface of said securing component is formed with a groove that extends in the direction of the imaginary axis, and the other one of said inner surface of said housing and said outer surface of said securing component has a protrusion configured to slidably engage said groove, such that said securing component is limited to move in the direction of the imaginary axis.

4. The ultrasonic sensor device of claim 1, wherein:
    said first signal transmitting pin of said inner connecting pin set is for transmitting a sensing signal from said piezoelectric member to said circuit board;
    said circuit board being configured to process the sensing signal from said first signal transmitting pin; and
    said outer connecting pin set includes
        a second signal transmitting pin having one end connected electrically to said circuit board for receiving the processed sensing signal, and another end extended into said connecting portion,
        a second grounding pin having one end connected electrically to said circuit board for electrical connection with said first grounding in via said circuit board, and another end extended into said connecting portion, and
        a power pin having one end connected electrically to said circuit board for transmitting electricity thereto, and another end extended into said connecting portion.

5. The ultrasonic sensor device of claim 1, wherein said base wall and said surrounding wall of said transducer cooperate to define a receiving space that receives said piezoelectric member, said ultrasonic sensor device further comprising a sealing component that fills said receiving space to encapsulate said piezoelectric member.

6. The ultrasonic sensor device of claim 1, further comprising a shock-absorbing component disposed in said surrounding wall to press against said piezoelectric member.

7. The ultrasonic sensor device of claim 6, wherein said base wall and said surrounding wall of said transducer cooperate to define a receiving space that receives said piezoelectric member and said shock-absorbing member, said ultrasonic sensor device further comprising a sealing component that fills said receiving space to encapsulate said piezoelectric member and said shock-absorbing component.

8. The ultrasonic sensor device of claim 1, further comprising a sealing component that fills said enclosing portion of said housing to encapsulate said circuit board and said securing unit.

* * * * *